(12) United States Patent
Tsironis

(10) Patent No.: US 11,327,101 B1
(45) Date of Patent: *May 10, 2022

(54) INTEGRATED PRE-MATCHING MODULE FOR IMPEDANCE TUNER

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 154 days.

This patent is subject to a terminal disclaimer.

(21) Appl. No.: 16/250,254

(22) Filed: Jan. 17, 2019

Related U.S. Application Data

(60) Provisional application No. 62/619,323, filed on Jan. 19, 2018.

(51) Int. Cl.
*G01R 27/32* (2006.01)
*H03H 7/40* (2006.01)

(52) U.S. Cl.
CPC ............. *G01R 27/32* (2013.01); *H03H 7/40* (2013.01)

(58) Field of Classification Search
CPC ................................ H03H 7/40; G01R 27/32
See application file for complete search history.

(56) References Cited

U.S. PATENT DOCUMENTS

| | | |
|---|---|---|
| 6,414,563 B1 | 7/2002 | Tsironis |
| 6,674,293 B1 | 1/2004 | Tsironis |
| 9,257,963 B1 | 2/2016 | Tsironis |
| 9,276,551 B1 * | 3/2016 | Tsironis ............... H03J 3/00 |
| 9,620,842 B1 * | 4/2017 | Tsironis ................ H01P 3/087 |
| 10,693,437 B1 * | 6/2020 | Tsironis ............. G01R 31/2822 |
| 10,700,402 B1 * | 6/2020 | Tsironis ............. G01R 31/2625 |

OTHER PUBLICATIONS

Load Pull [online], Wikipedia [retrieved on Nov. 18, 2016], Retrieved from Internet <URL:https://en.wikipedia.org/wiki/Load_pull>.
"Computer Controlled Microwave Tuner—CCMT", Product Note 41, Focus Microwaves, Jan. 1998.
"Titan TM Probe Technologies", [online] MPI Corporation [Retrieved on Dec. 23, 2017] Retrieved from Internet <URL: http://www.mpi-corporation.com/ast/mpi-rf-probes-accessories/titan-probe-technologies/>.
"Multipurpose Tuners Control Impedances from 20 to 110 GHz", MW&RF Magazine, Mar. 2017.

* cited by examiner

*Primary Examiner* — Samuel S Outten

(57) ABSTRACT

An integrated manual pre-matching module for on-wafer load pull tuner operation uses a mobile rack and a rotating reflective probe, mounted and sliding on the tuner slabline extension.
Both the tuning probe position and immersion into the slabline are controlled using sidewise mounted easily accessible knobs. The low profile of the module does not conflict with the microscope and allows integrating on the extended slabline of the tuner in immediate proximity of the wafer probe, thus minimizing any additional insertion loss and maximizing tuning range. Manual handling of the pre-matching tuning module is easy and efficient without disturbing the on-wafer load pull operations.

8 Claims, 13 Drawing Sheets

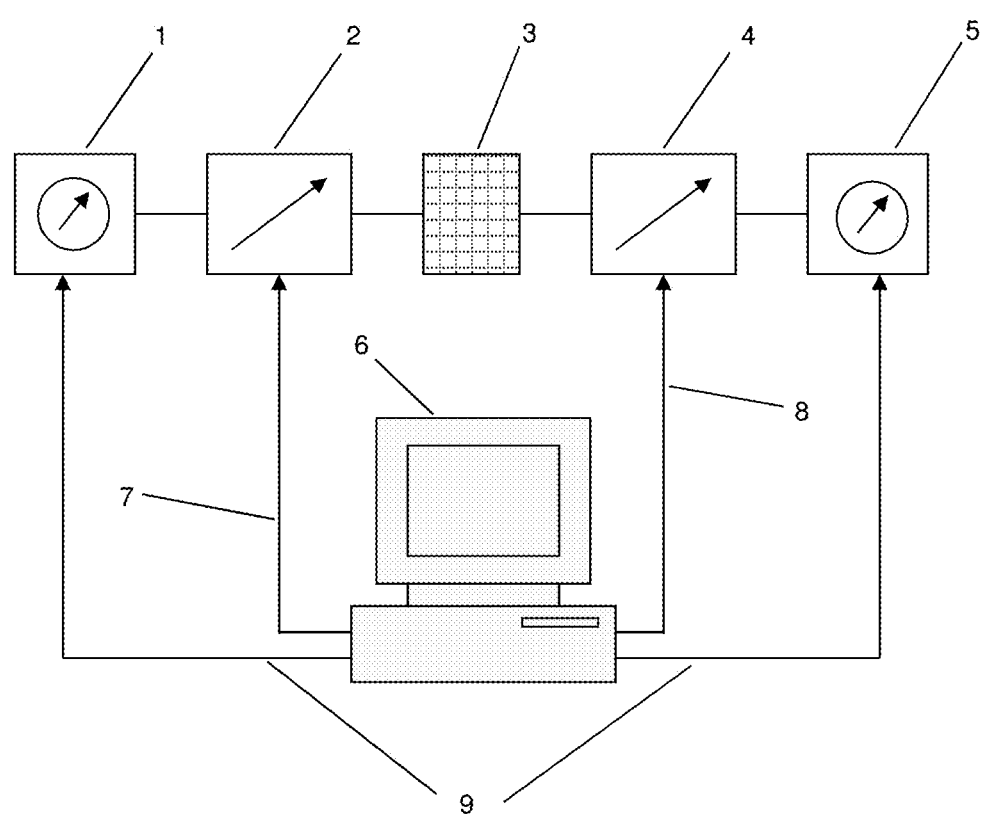
FIG. 1: Prior art

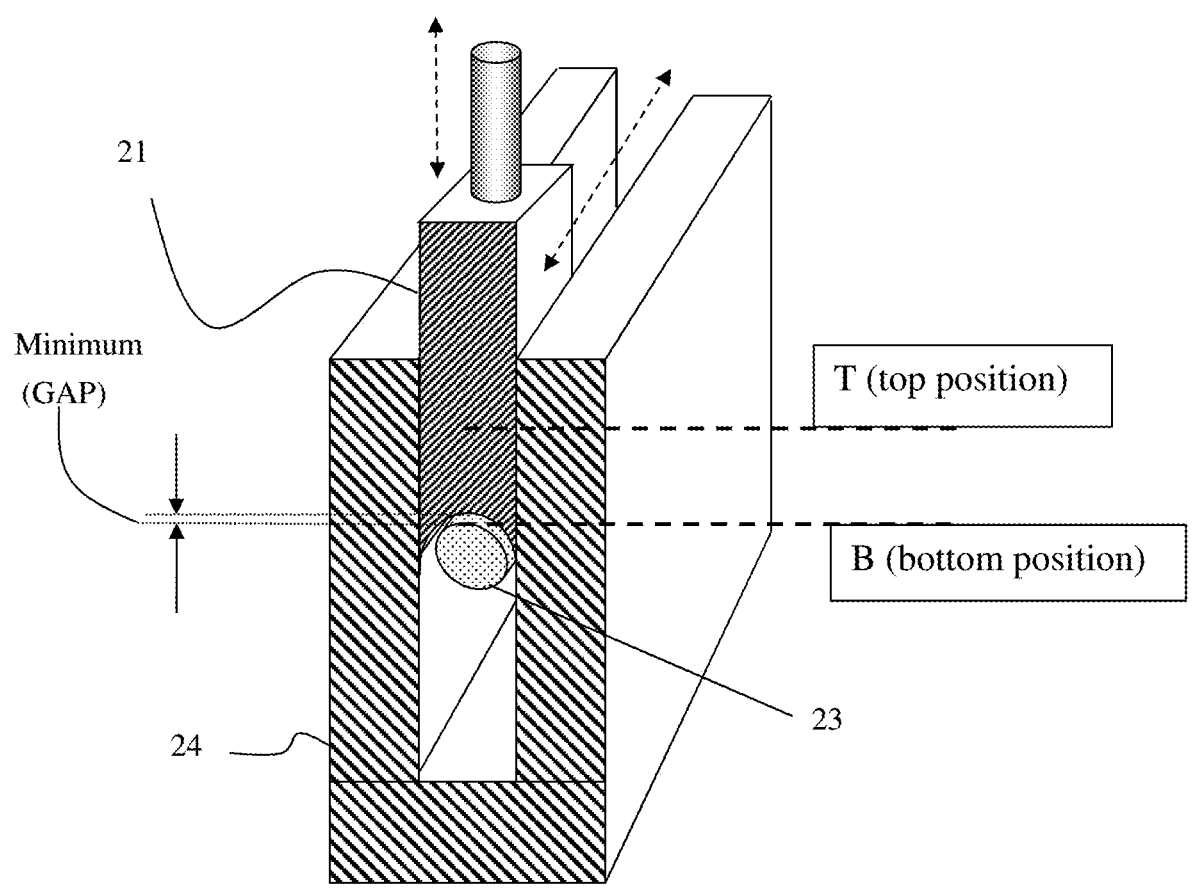
FIG. 2: Prior art

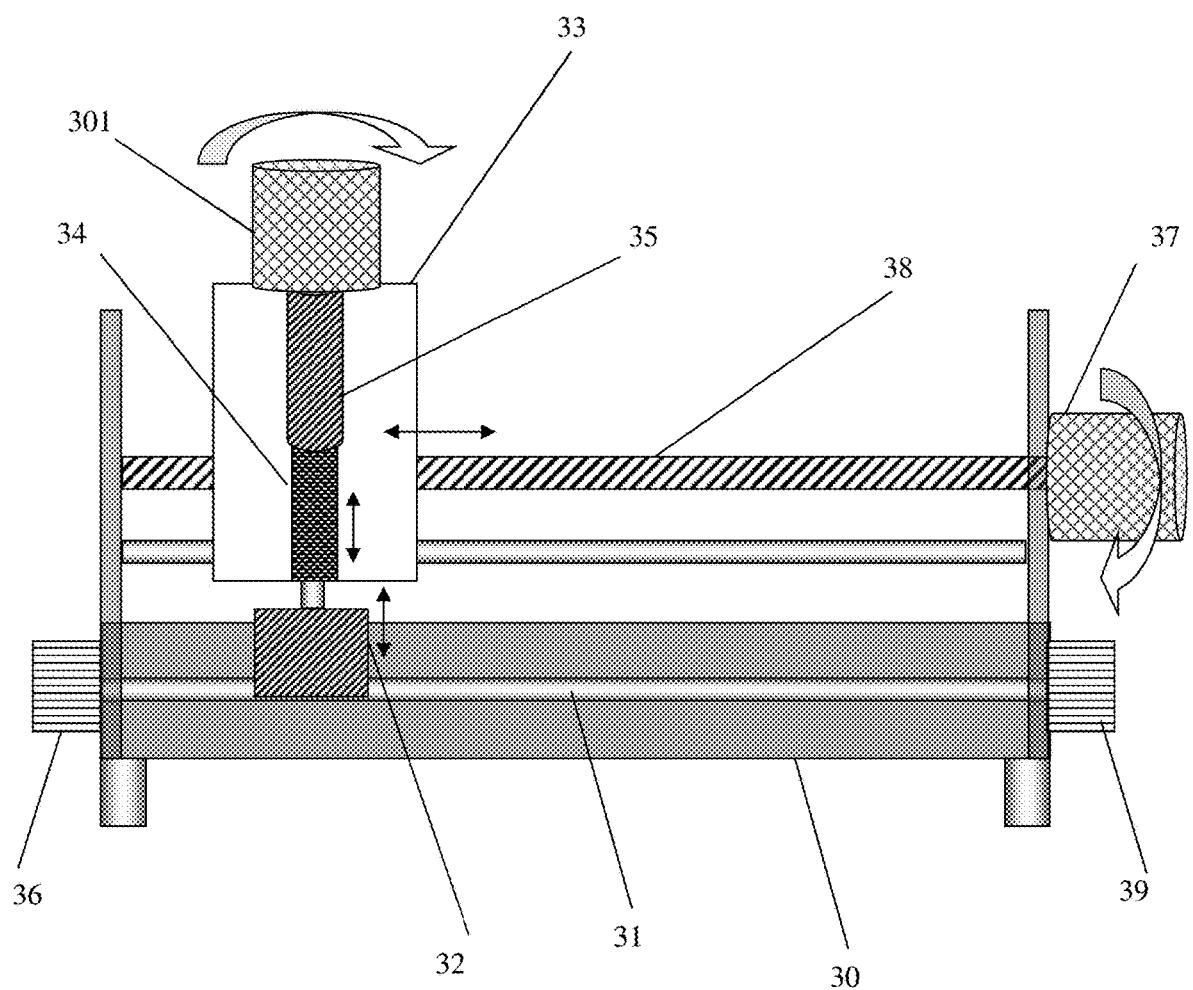
FIG. 3: Prior art

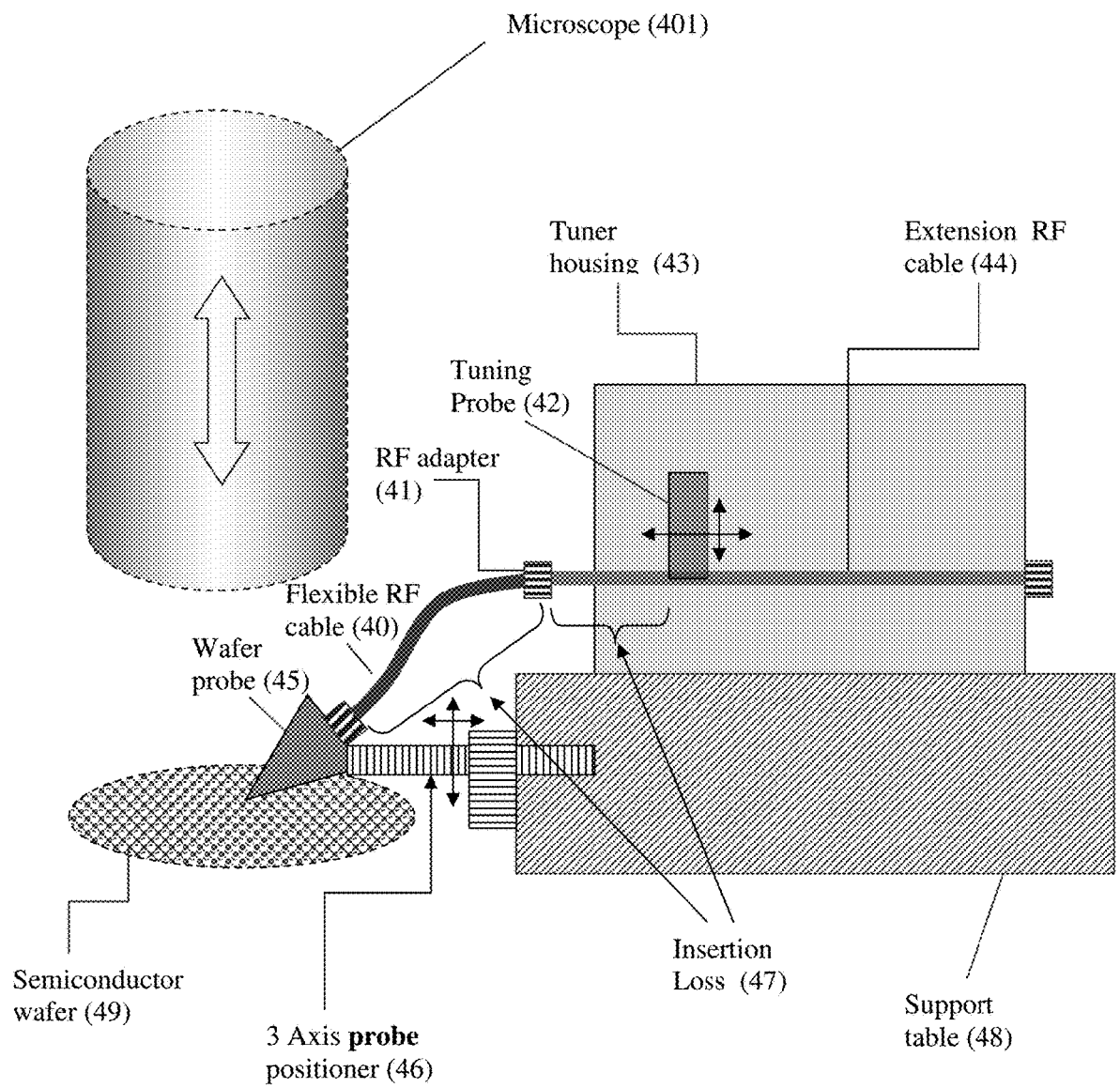
FIG. 4: Prior art

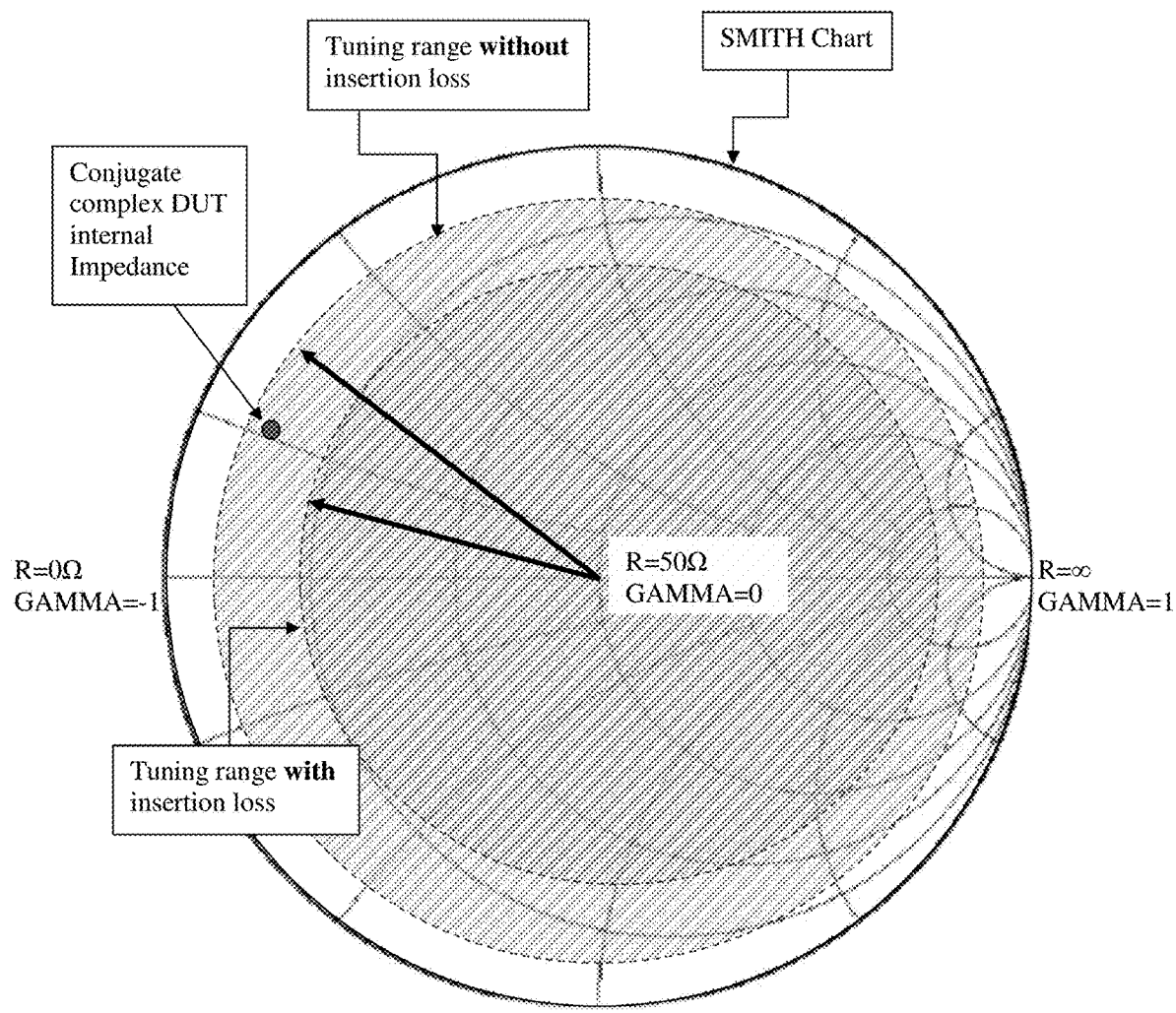
FIG. 5: Prior art

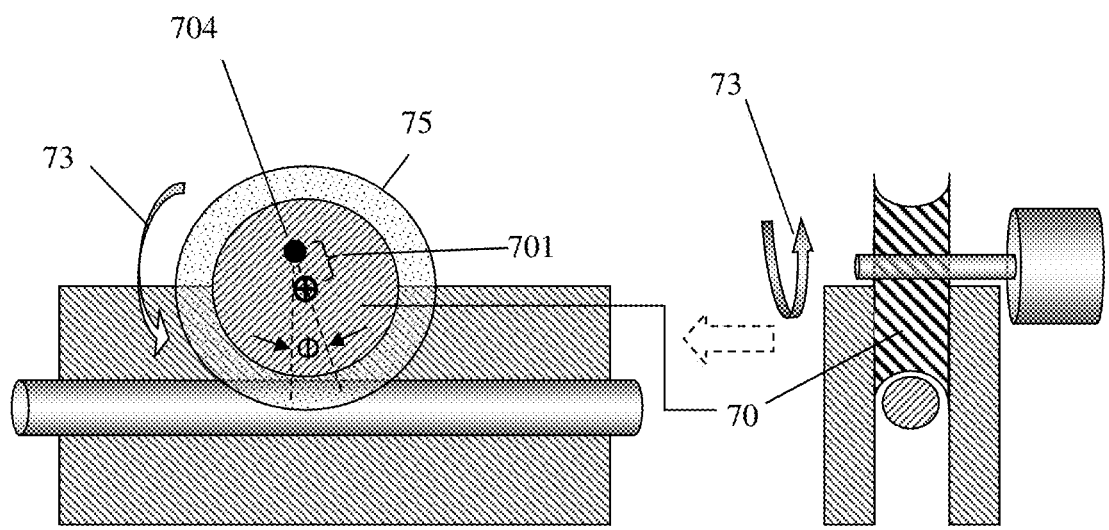
FIG.7A: Prior art
FIG. 7B: Prior art

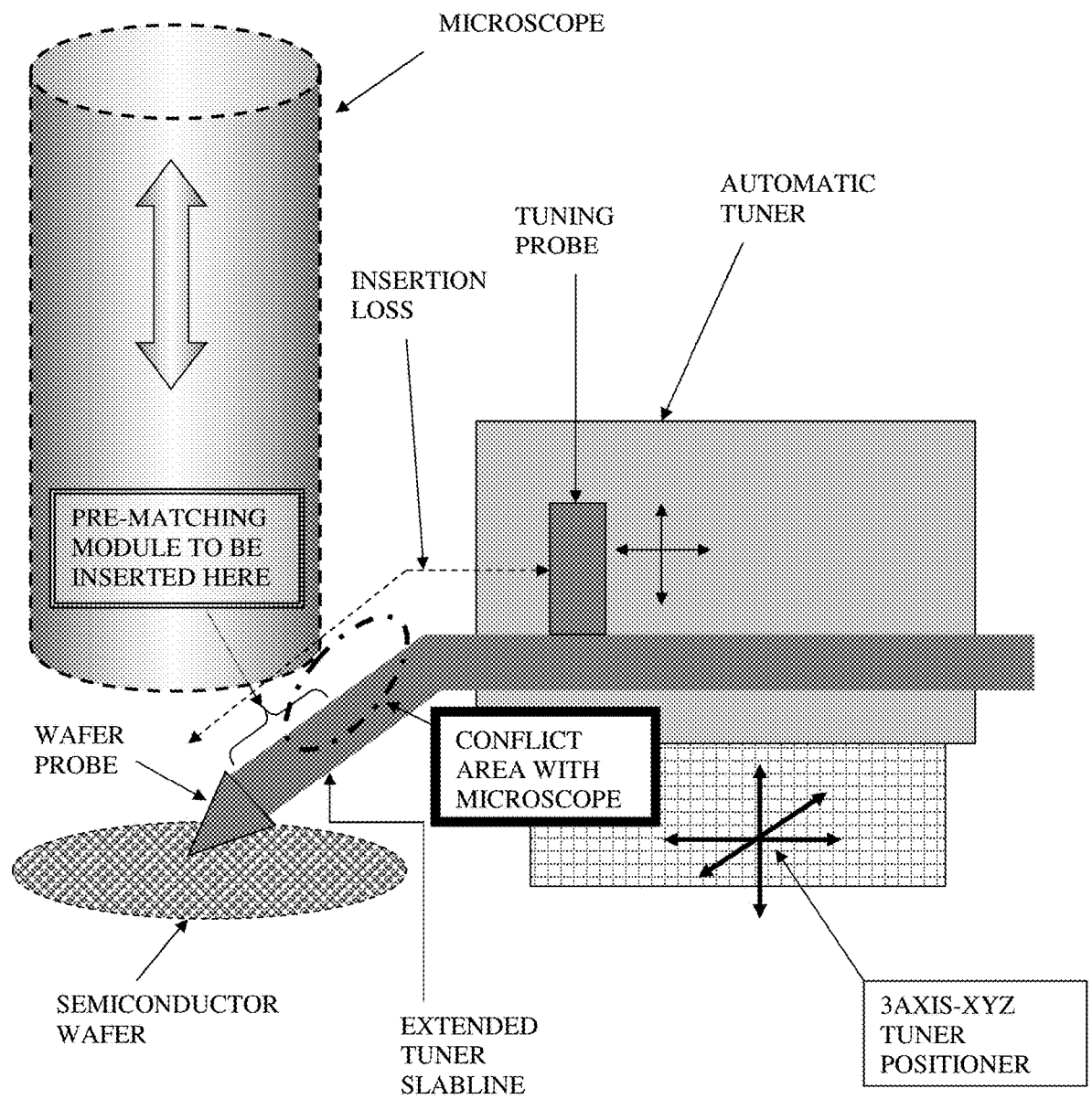
FIG. 13: Prior art

US 11,327,101 B1

INTEGRATED PRE-MATCHING MODULE FOR IMPEDANCE TUNER

PRIORITY CLAIM

This application claims priority on provisional application 62/619,323, filed on Jan. 19, 2018 titled: "Integrated Pre-Matching Module for Millimeter-Wave Tuner".

CROSS-REFERENCE TO RELATED ARTICLES

1. "Load Pull", [online], Wikipedia [Retrieved on Nov. 18, 2016] Retrieved from Internet <URL: http://en.wikipedia.org/wiki/Load_pull>.
2. "Computer Controlled Microwave Tuner—CCMT", Product Note 41, Focus Microwaves, January 1998.
3. "TITAN™ Probe Technologies", [online] MPI Corporation [Retrieved on Dec. 23, 2017] Retrieved from Internet <URL: http://www.mpi-corporation.com/ast/mpi-rf-probes-accessories/titan-probe-technologies/>.
4 TSIRONIS, U.S. Pat. No. 6,414,563, "Low-Loss Microwave Device Test Fixture with Adjustable Blocks".
5. "Multipurpose Tuners Control Impedances from 20 to 110 GHz", MW&RF Magazine, March 2017.
6. TSIRONIS, U.S. Pat. No. 6,674,293, "Adaptable Pre-matched Tuner System and Method".
7. TSIRONIS, U.S. Pat. No. 9,257,963, "Impedance Tuners with Rotating Probes".

BACKGROUND OF THE INVENTION

This invention relates to RF active load and source pull testing of medium and high-power millimeter-wave (mm-wave) transistors and amplifiers.

Modern design of low noise or high-power mm-wave amplifiers and mixers, used in various communication systems, requires accurate knowledge of the active device's characteristics. In such circuits, it is insufficient for the transistors (device under test, DUT), which operate as highly non-linear devices, close to power saturation, to be described using linear or non-linear numeric models.

A popular method for testing and characterizing such microwave components (transistors) in the non-linear region of operation is "load pull" or "source pull". Load/source pull is a measurement technique (see ref. 1) employing microwave impedance tuners and other microwave test equipment (FIG. 1), such as signal source (1), input and output tuners (2, 4), see ref. 2, power meter (5) and test fixture (3) which houses the DUT. In millimeter-wave frequencies test fixtures are typically wafer-probes (see ref. 3), allowing direct access to the semiconductor chips; other types of fixtures have too many parasitical components (packages, stray capacitors, lead inductors) that would mask strongly the real device (see ref. 4). The tuners and equipment are controlled by a computer (6) via digital cables (7, 8 and 9). The impedance tuners are instruments which allow manipulating the millimeter-wave (mm-wave) impedance presented to the Device Under Test (DUT); this document refers hence to "impedance tuners", in order to make a clear distinction to "tuned receivers (radios)", popularly called elsewhere also "tuners" because of the included tuning circuits.

Mechanical impedance tuners (FIGS. 2 and 3), manual or automatic, in the microwave and millimeter-wave frequency range between 100 MHz and 110 GHz (see ref. 2 and ref. 5) are using the slide-screw concept and include a slabline (24), (30) with a test port (36) and an idle port (39), a center conductor (23, 31) and one or more mobile carriages (33) which carry a precise, relatively long, micrometric finely threaded screw (35) to which a vertical axis (34) is attached and which controls the vertical position of a reflective probe (21), (32). The precision screw (35) has to be long enough to have enough thread engaged to avoid wobbling and backlash. The whole vertical mechanism is controlled either by a stepper motor, if the tuner is automated, or, as is the case here, for a manual pre-matching module, using a knob (301); depending on the nature of the device, therefore item (301) can be a remotely controlled motor or a manual knob. The same is valid for item (37). The insertion mechanism of the tuning probe (21) into the slabline (24) is shown in detail in FIG. 2. The carriage is moved horizontally by additional ACME screw (38) and motor or manual knob (37). The signal traverses from one port to the opposite. In load pull the test port is the input port, the one where the signal enters coming out of the DUT, in source pull the test port is the output port, the one where the signal exits to be injected into the DUT. The entire mechanism is, typically, integrated in a solid housing since mechanical precision is of highest importance; but all this complex mechanics renders the mechanical slide screw tuner cumbersome and difficult to integrate on a wafer probe station.

When a simple mechanical tuner is used ((2), (4) in FIG. 1), we speak of a passive load pull system. The tuning range (FIG. 5) of such a system is limited, essentially because of unavoidable insertion loss between the tuner and the DUT ((47) in FIG. 4), which means the passive tuner in the load pull system cannot reach the conjugate complex internal impedance and power-match many high-power transistors, which have a small internal impedance (FIG. 5).

BRIEF DESCRIPTION OF THE INVENTION

To increase the tuning range of such a system, one needs: (a) an integrated extended slabline (FIGS. 6, 8 and 9), to avoid lossy RF cables and reduce the insertion loss and (b) a pre-matching module, integrated into the slabline (FIGS. 8 and 9), placed closest to the DUT, which increases the tuning range at selected angles (vector (101) in FIG. 10), see ref. 6.

The typical configuration of the reflective probe (21) inside the slabline (24) is shown in FIG. 2. However, a compact pre-matching module cannot be integrated on the extended slabline (FIGS. 8 and 9) using such a long vertical axis (34) with associated control screw (35), because, if mounted close to the wafer probe, it will conflict mechanically with the microscope (area marked "CONFLICT AREA WITH MICROSCOPE" in FIG. 13); therefore, the vertical axis, which is the main obstacle to the integration, must be eliminated. Using a rotating reflective disc probe (61), (70) shown in FIGS. 6A, 6B and 7 (see ref. 7) allows that: the eccentric rotation (601) approaches the probe to the center conductor (602) or pulls away from it; this creates the adjustability of the reflection factor without the need of the cumbersome long vertical axis (34) and control (35) mechanism. Since horizontal movement of the probe is done using the ACME rod (38), this configuration requires a cumbersome carriage (33) and, when the device is manually controlled, manual access from the front or the back (37) of the extended slabline towards the wafer-probe or the tuner body, which is impractical, near impossible, in an integrated setup (FIG. 9), since at the front there is the wafer probe and at the back the tuner housing; the solution employed in this invention uses a mobile rack (85), (95) instead of an ACME rod; the mobile rack, as shown in FIGS. 8 and 9, is pushed or pulled along the slabline using a pinion (86), (96) with an axis fixed against the slabline using the bracket (801); again, other than in prior art typically implemented, the pinion is not mobile travelling on the fixed rack, instead the pinion is fixed on a bracket (801) and the rack (85) is mobile travelling/sliding (88) along the slabline. The axis of the rotating probe (81) is inserted into a hole at the end of the rack and moves with the rack along the slabline (83), controlling this way the phase of the reflection factor. Manual knob (84) rotates (87) the probe (81), which, being anchored eccentrically on the axis (704) controls the amplitude of the reflection factor, as seen in FIGS. 7A and 7B.

BRIEF DESCRIPTION OF THE SEVERAL VIEWS OF THE DRAWINGS

The invention and its mode of operation will be more clearly understood from the following detailed description, when read with the appended drawings in which:

FIG. 1 depicts prior art, a typical automated load pull test system.

FIG. 2 depicts prior art, RF probe (slug) inside a slotted airline (slabline) approaching the center conductor in a perspective view and the relevant dimensions and parameters of the operation.

FIG. 3 depicts prior art, a front view of a manual slide screw impedance tuner using a single vertical axis and RF tuning probe (slug).

FIG. 4 depicts prior art, on-wafer load pull using slide-screw tuner and flexible RF cable between tuner and wafer-probe.

FIG. 5 depicts prior art, the effect of insertion loss on tuning range at the DUT reference plan.

FIG. 6A depicts a front view; FIG. 6B depicts a perspective view.

FIGS. 7A through 7B depict prior art, the concept of a disc tuning probe: FIG. 7A depicts a front view; FIG. 7B depicts a cross section.

FIG. 13 depicts prior art, a tuner with inclined extended slabline in on-wafer integration and the contours of the microscope, the conflict with which the integrated module must avoid.

DETAILED DESCRIPTION OF THE INVENTION

Figure 8:
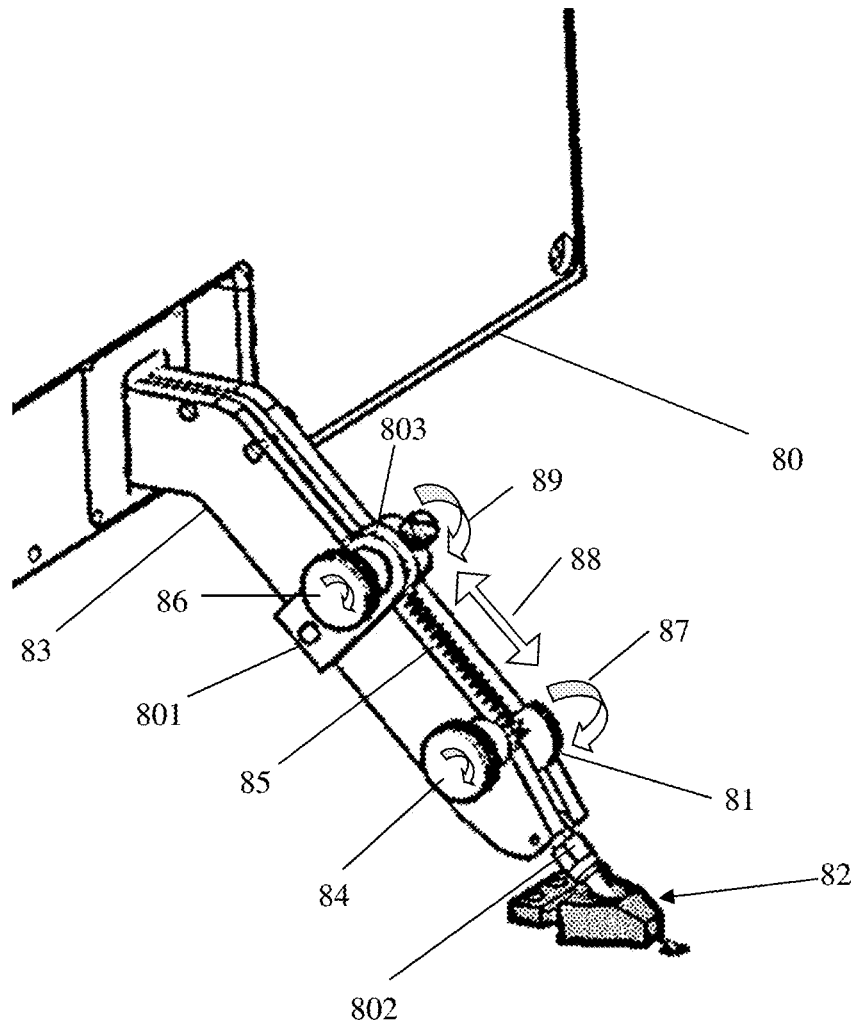
FIG. 8 depicts a perspective view of a manual pre-matching tuner module integrated into the inclined extended slabline of an automated impedance tuner.
Figure 9:
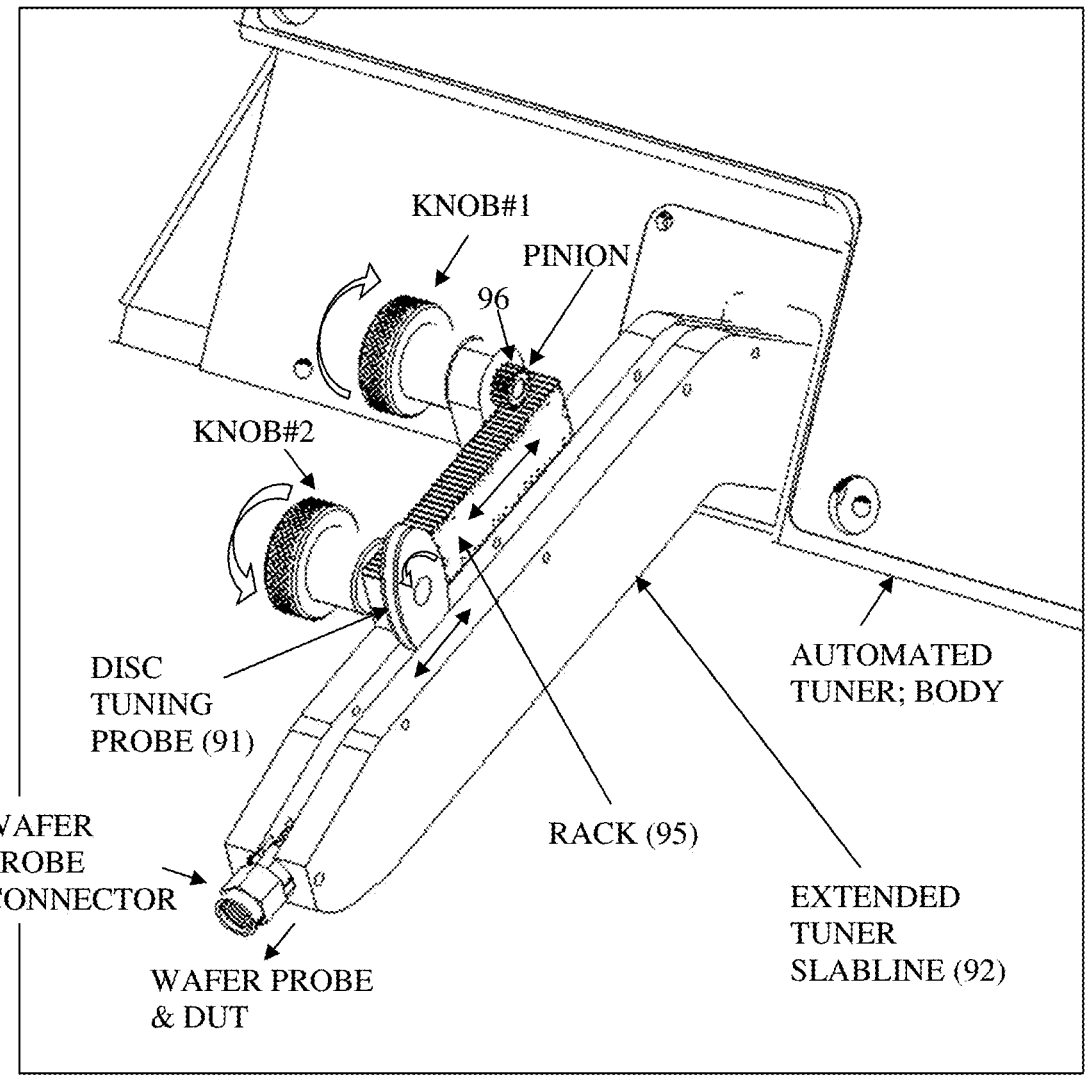
FIG. 9 depicts an opposite view of the tuner of FIG. 8, showing the exact manipulations.
Figure 11:
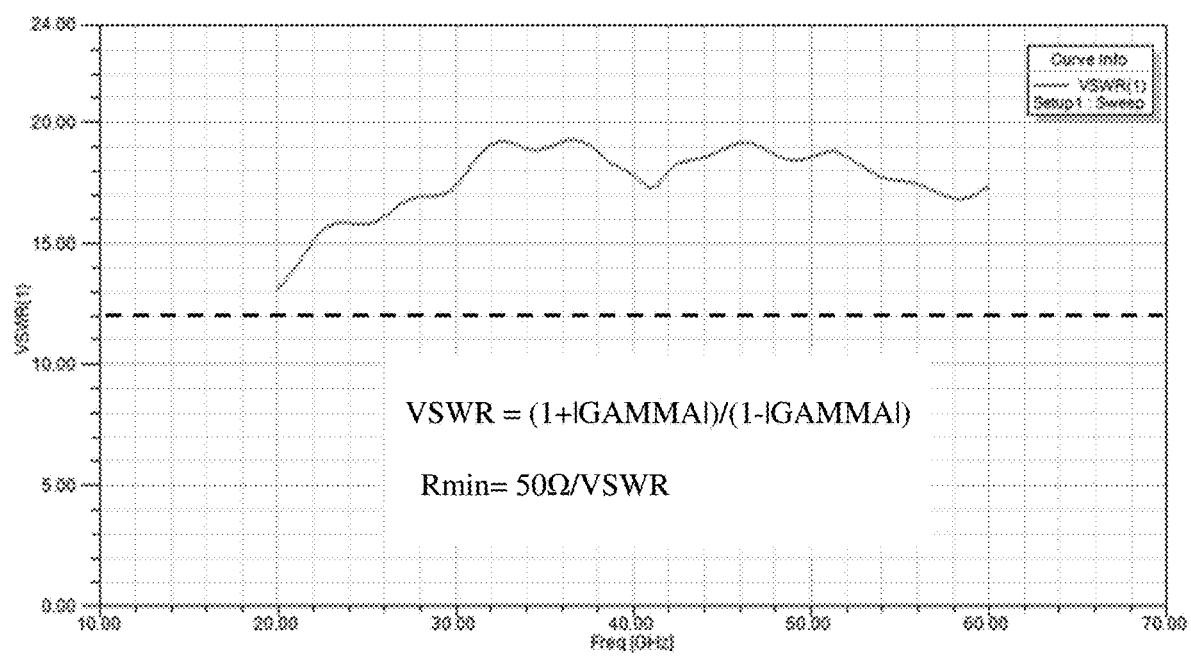
FIG. 11 depicts maximum Voltage Standing Wave Ratio (VSWR) of pre-matching module from 20 to 60 GHz, easily extendable to 67 GHz.

This invention discloses a new manual pre-matching tuner module that can be easily integrated into the extended slabline of an automatic slide screw tuner. The module in its present experimental embodiment operates best for frequencies between 20 and 67 GHz (FIG. 11), but the concept is generally valid, and the lowest frequency of operation is only limited by the available travel of the probe along the extended slabline. The reflection factor GAMMA created by the module is related to the VSWR shown in FIG. 11 as follows: |GAMMA|=(VSWR−1)/(VSWR+1): VSWR=15 corresponds to |GAMMA|=0.875. The minimum tunable resistance is Rmin=50 Ω/VSWR, or a tuner generating VSWR=15 reaches Rmin=3.3Ω. The pre-matching module enables a tuner of average performance to easily reach these values. The module comprises the following key components (FIGS. 8 and 9):
1) A mobile rack (95), (85) that slides easily on the slabline (92), (83) wall.
2) Disc-probe (91) rotated by a side KNOB #2 (FIG. 9).
3) A fixed pinion (96) that moves the mobile rack (95) and is controlled by KNOB #1 (FIG. 9).

The purpose for this invention is twofold: (a) to increase the overall tuning range using pre-match (FIG. 10) and (b) integrate the pre-matching device as close to the wafer-probe (82) as possible (FIG. 8) to minimize insertion loss. Insertion loss, due to the use of RF cable (40) and adapters (41), needed to connect the DUT to the tuner, reduces the tuning range twofold (FIG. 5): the energy generated by the DUT loses a portion on its way to the tuner; and it loses the same portion on its way back, since it is the ratio of reflected to injected power, which is the reflection factor (or tuning range); several DUT cannot be physically matched because of this, i.e. the capacity of the tuning probe (42) of the tuner match the DUT internal impedance, which means that the specific DUT cannot be tested using the specific load pull system. In particular the flexible RF cable (40) (FIG. 4) is far too lossy at higher frequencies, introducing, typically, 2.5-3 dB insertion loss; in this configuration the insertion loss of the RF cable (44) between the tuning probe (42) and the output port is irrelevant and does not affect the tuning range critically; only insertion loss between DUT and tuning probe (42) matters. To minimize the insertion loss, and maximize the tuning range, a technique called "extended tuner slabline" has been used instead of the RF cable (FIG. 13); this solution alone offers: (a) lower insertion loss (because of the need for one less adapter (41) and because the slabline is the lowest loss solution, having air as dielectricum, instead of Teflon in RF cables), and (b) the possibility to integrate a manual pre-matching module on the slabline itself as close to the wafer-probe (45) and DUT on the semiconductor wafer (49) as physically possible. In this prior art setup, the tuner (43) is fixed on the support table (48) and the wafer-probe (45) is controlled by the 3-axis probe (not tuner) positioner (46), which is attached to the permanent support table (48). In this embodiment, (FIG. 4) however, a pre-matching module, as disclosed here, cannot be used.

As already explained an integrated manual pre-matching module requires solving at least two basic structural problems regarding (a) the vertical axis and (b) the horizontal control: (a) the vertical axis, as shown in FIG. 3 (34, 35), is incompatible with the microscope (401) in FIG. 4 and in FIG. 13, and (b) the horizontal control, as shown in FIG. 3 (37, 38), cannot be implemented on the extended bent slabline (83) either, because of conflict with the tuner body (80) towards the top end, and towards the wafer-probe (82) at the bottom end (FIG. 8). The angle of the inclination of the extended portion of the bent slabline is dictated by the angle of the wafer-probe, to achieve seamless connection between the tuner adapter and the wafer-probe connector. Wafer probes are available with coaxial connectors directed upwards (angle=90°) or sloped at 30 or 45°, which are the preferred embodiment. The objective is to integrate the manual pre-matching module on the inclined portion (83) of the extended slabline, as close to the wafer-probe (82) as physically possible to minimize insertion loss between the DUT and the disc-probe (61) at the test port (60), while avoiding mechanical conflict with the microscope (FIG. 4 and FIG. 13) and allow manipulations avoiding mechanical conflict with the tuner body (80) and the wafer probe (82). All these requirements are satisfied with the herein disclosed manual module.

Figure 6A:
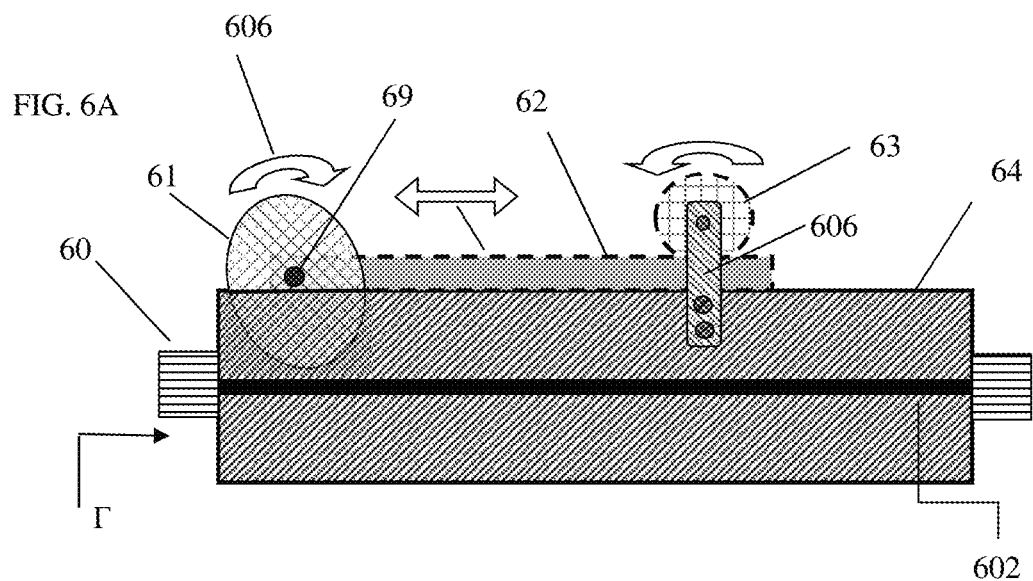
FIGS. 6A through 6B depict a compact manual pre-matching tuner.
Figure 6B:
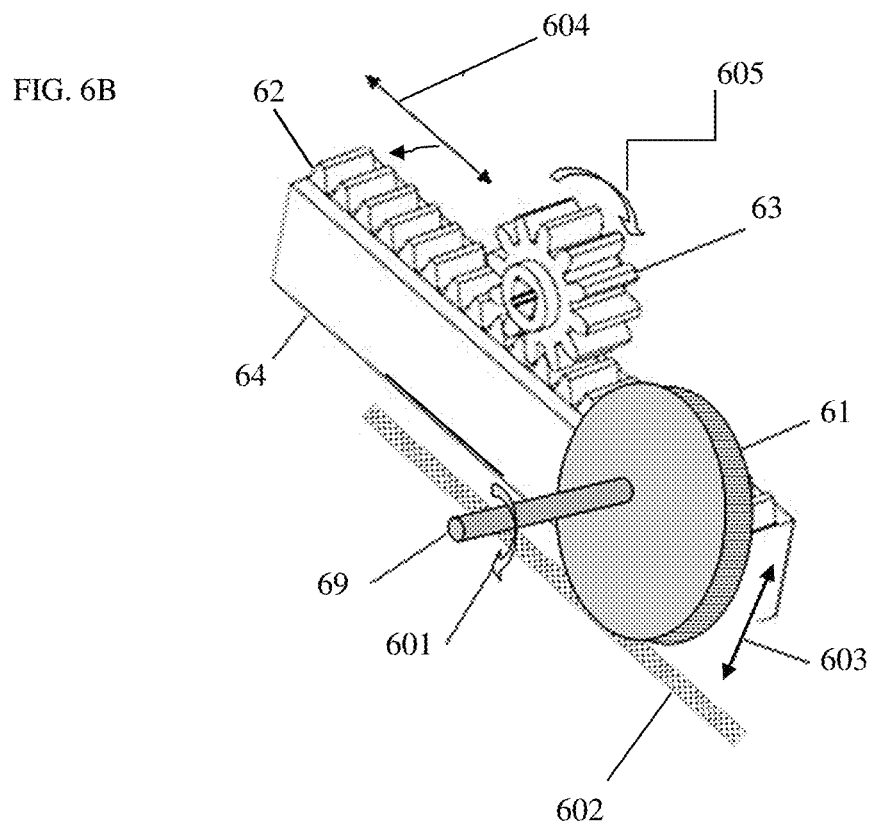

The solution proposed in this invention for the pre-matching module is depicted in FIG. 6A and FIG. 6B: It employs (i) a rack and pinion mechanism and (ii) a tuning probe in form of an eccentrically rotating disc. However, the way the rack-and-pinion control mechanism is implemented here, is different from a conventional one. In a conventional case a pinion assembly (63) rolls on a fixed rack (62). In the present embodiment the pinion (63) is fixed using a bracket (606) on the body of the slabline (64) on which the rack (62) is sliding. The eccentrically rotating circular or oval disc-probe (61) on the other hand rotates around an axis (69), which traverses the rack (62) at its one end. This rotation (606) inserts or withdraws (603) the probe (61) to various depths inside the slot of the slabline resulting in various distances of the concave probe (70) bottom from the center conductor (602). The rotation of the disc-probe ensures controlled penetration of the probe into the slot of the slabline and coupling with the center conductor (602), and thus controls the amplitude of the reflection factor (|GAMMA| (|Γ|)); the rotation (605) of the pinion (63) pulls (604) the sliding rack along the axis of the slabline and pulls the disc-probe (61) along and thus controls the phase <GAMMA, (Φ) of the reflection factor relative to the test port (60).

Comparing with the prior art configuration of slide screw tuners, the rack (62) replaces the ACME rod (38) and the rotation (73) of the disc-probe (75) replaces the vertical axis (34, 35); therefore the horizontal and vertical control mechanisms present now an extremely low profile which makes the pre-matching tuning module of FIG. 5 compatible with the microscope (401) and accessible to manual control from one side only, using knobs #1 and #2 (FIGS. 8 and 9). Using oval or elliptical (61) tuning probes instead of eccentrically rotating circular tuning probes allows controlling the probe penetration into the slabline slot, even if the rotation (704) is not eccentrical (701).

A perspective view of the pre-matching tuning module is shown in FIGS. 6B and 8. the rack (62) is moving horizontally (604) controlled by the rotating (605) pinion (63). The pinion (63) is mounted on a bracket (606), which is permanently attached to the slabline wall (64). The pinion (63) rotates only, it does not move horizontally. The axis (69) of the disc tuning probe (61) rotates inside a traversal hole into the rack (62) and is pulled by it. Both movements are easily accessible manually from the side, using the two knurled knobs (84) and (86) in FIG. 8. The position of the fixed bracket (606) can be adjusted to be at the closest position to the DUT and for the disc-probe (81) to be as close to the wafer-probe (82) as physically possible, avoiding mechanical conflict with the microscope.

Figure 10:
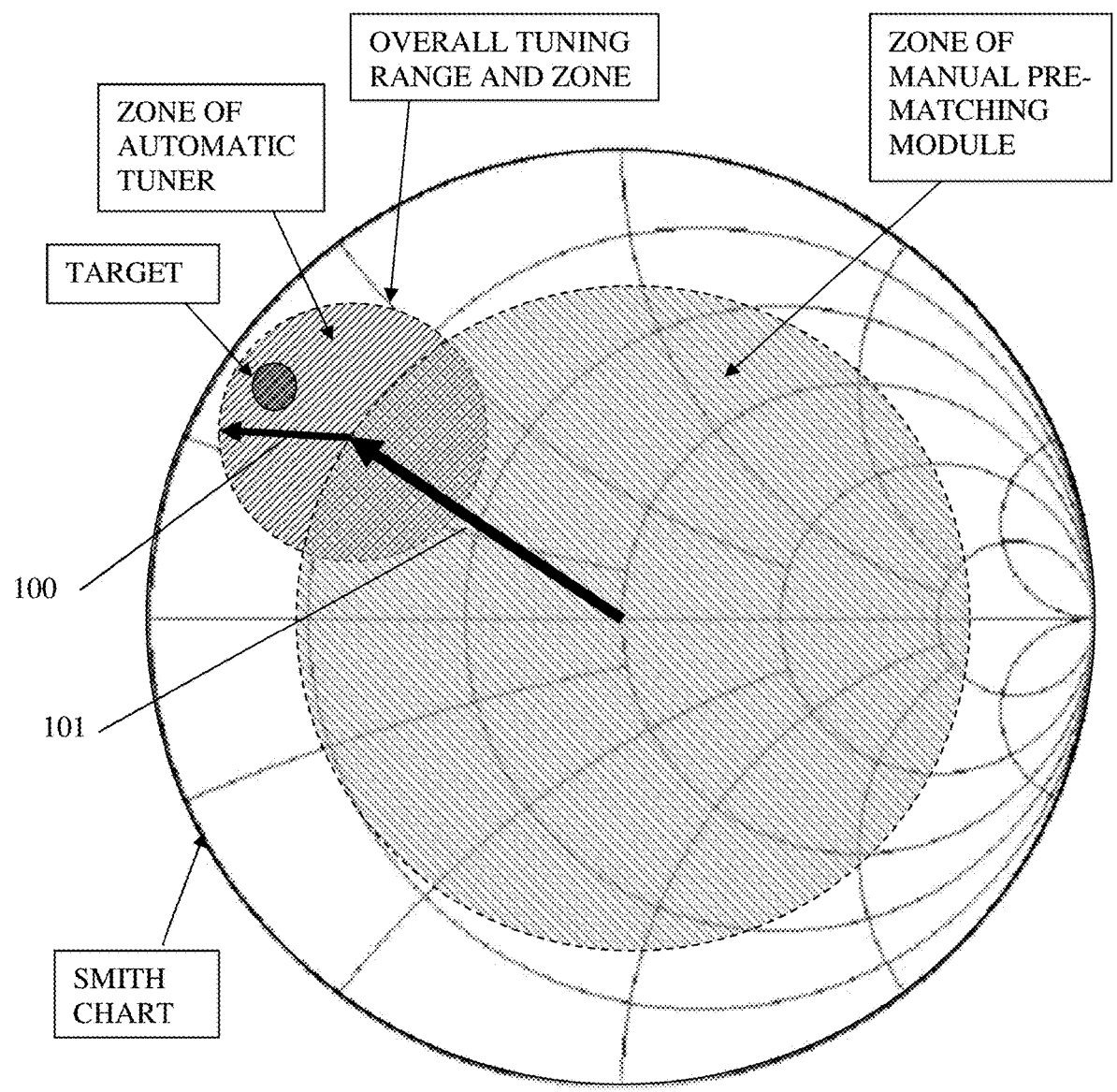
FIG. 10 depicts the pre-matching and automatic tuning mechanism on the Smith chart.

In FIGS. 8 and 9 all significant components and the operation of the integrated pre-matching module are shown: The tuner body (80) with the extended bent slabline (83); the rack (85) sliding (88) on top and along one wall of the slabline extension (83); the bracket (801) holding the pinion (803) and the knob (86) which rotates (89) the pinion (803); then the second knob (84) which rotates (87) the disc-probe (81). In view of all this the tuning mechanism is clear: turning knob (86) controls the phase and turning knob (84) controls the amplitude of the pre-matching vector (101). Automatic tuning (100) by the tuning probe (42) itself is then superposed to pre-matching (FIG. 10). A representative view of the opposite side of the pre-matching module is shown in FIG. 9. The length of the rack must be slightly over one half of a wavelength (λ/2) at the lowest test frequency. At F=20 GHz half the wavelength is 7.5 mm (0.295"). This is easily compatible with the actual dimensions of typical tuners and wafer-probes (a wafer probe (45) coaxial adapter for comparison, has a body size of similar dimensions (6.5 to 7.5 mm).

Figure 12:
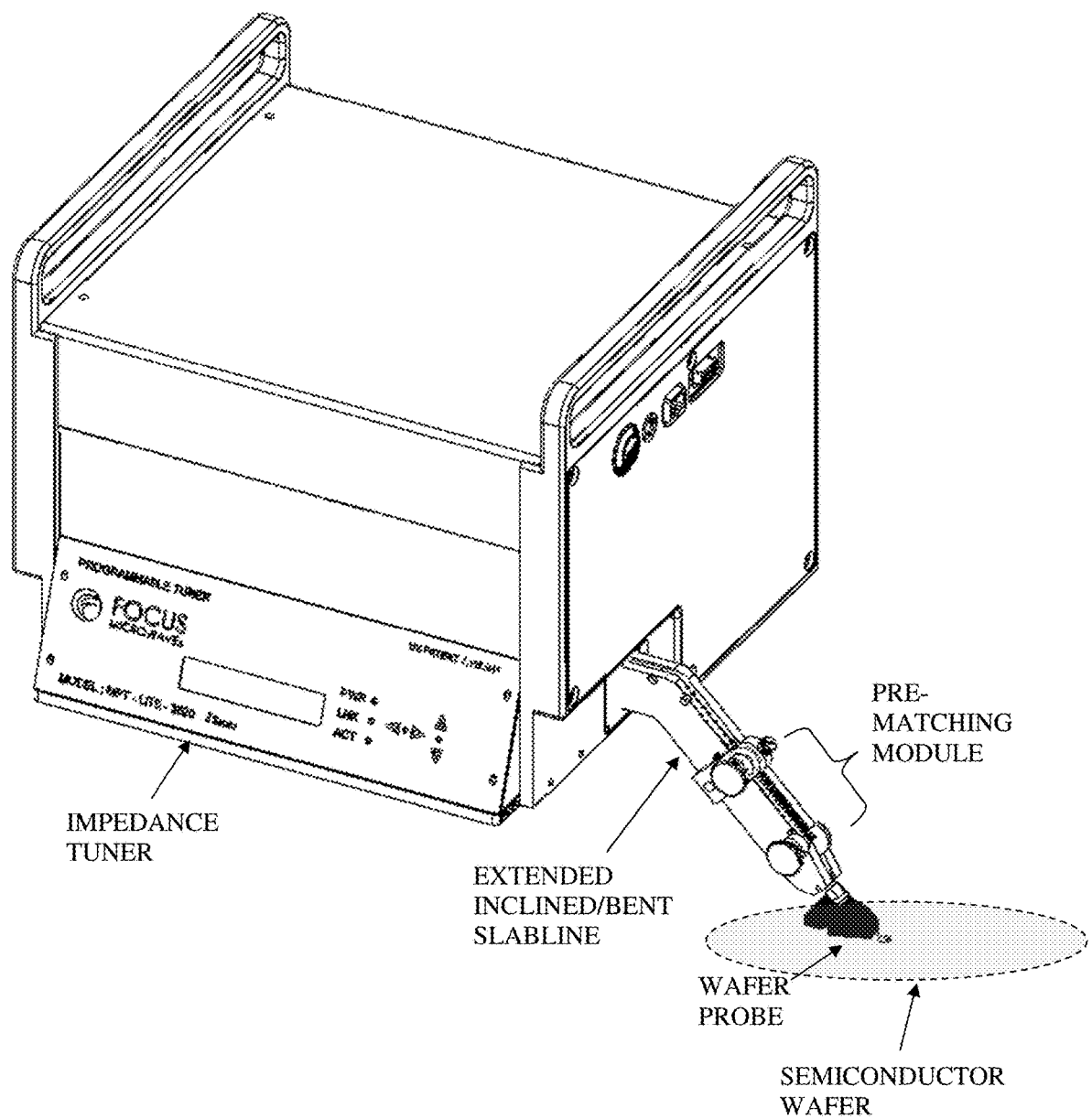
FIG. 12 depicts the perspective view of the tuner with extended slabline and integrated pre-matching module.

FIG. 12 shows the complete configuration of the manual pre-matching module on the extended bend slabline of the tuner, mount for a high GAMMA on-wafer load or source pull operation.

In real operation the angle of the pre-matching tuning must be directed towards the TARGET, i.e. the conjugate output reflection factor of the DUT, vector (101) in FIG. 10; The automatic tuner, then can tune (100) around the peak of the arrow (101) creating an overall tuning zone marked as "ZONE OF AUTOMATIC TUNER". This tuning zone, then surrounds the TARGET impedance. The remaining small distance between the maximum of this tuning zone and the periphery of the Smith chart is due to the loss of the adapter (802) between pre-matching module and wafer-probe and can, at the present time, not be avoided.

This invention has been described in a basic preferred embodiment; obvious alternatives and configurations, to the disclosed concept of low profile manual pre-matching tuner modules based on rack-made sliding carriages and rotating disc probes, are possible but shall not impede on to the validity of the present invention.

What I claim as my invention is:

1. A manual pre-matching module, mounted on the slabline of an impedance tuner, comprising
   a rack and pinion mechanism,
   a metallic tuning disc-probe having an axis and concave periphery,
   two manual control knobs #1 and #2,
   wherein
   the tuner has a housing, a test port and an idle port,
   the slabline has two sidewalls and a center conductor,
   the rack slides on top of and along one sidewall,
   the pinion is attached to the sidewall and controls the rack,
   the disc-probe is insertable between the sidewalls and its axis traverses the rack and is perpendicular to the slabline.

2. The disc-probe of claim 1 is circular and rotates eccentrically.

3. The disc-probe of claim 1 is elliptical.

4. The disc-probe of claim 1 is oval.

5. The tuner of claim 2 or 3 or 4,
   wherein
   the slabline extends beyond the tuner housing at the test port,
   the extended portion is inclined to match a wafer-probe,
   the module is mounted on the extended inclined portion,
   and wherein
   the penetration of the disc-probe between the sidewalls is controlled by rotating the disc using knob #2;
   the position of the rack along the slabline is controlled by rotating the pinion using knob #1.

6. The module as in claim 1,
   wherein
   the rotational axis of the pinion is attached to a bracket, which is anchored on the side of the slabline sidewall, on which the rack slides.

7. The slabline as in claim 1,
wherein the distance between the vertical sidewalls and the diameter of the center conductor are selected to form a characteristic impedance Zo=50Ω.

8. The module of claim 1
wherein
the disc-probe, slide fits between the sidewalls of the slabline and immerses or withdraws, approaching the center conductor when rotated by the knob #2.

* * * * *